(12) United States Patent
Azdasht

(10) Patent No.: US 11,618,094 B2
(45) Date of Patent: Apr. 4, 2023

(54) SOLDER BALL FEEDING DEVICE

(71) Applicant: Pac Tech—Packaging Technologies GmbH, Nauen (DE)

(72) Inventor: Ghassem Azdasht, Berlin (DE)

(73) Assignee: Pac Tech—Packaging Technologies GmbH, Nauen (DE)

( * ) Notice: Subject to any disclaimer, the term of this patent is extended or adjusted under 35 U.S.C. 154(b) by 142 days.

(21) Appl. No.: 15/930,094

(22) Filed: May 12, 2020

(65) Prior Publication Data

US 2020/0269336 A1  Aug. 27, 2020

Related U.S. Application Data

(62) Division of application No. 15/323,797, filed as application No. PCT/EP2015/066194 on Jul. 15, 2015, now abandoned.

(30) Foreign Application Priority Data

Jul. 15, 2014  (DE) ...................... 10 2014 109 890.0

(51) Int. Cl.
| | |
|---|---|
| *B23K 3/06* | (2006.01) |
| *H05K 3/34* | (2006.01) |
| *B23K 1/00* | (2006.01) |
| *B23K 101/42* | (2006.01) |

(52) U.S. Cl.
CPC .......... *B23K 3/0623* (2013.01); *B23K 1/0016* (2013.01); *H05K 3/3478* (2013.01); *B23K 2101/42* (2018.08); *H05K 2203/041* (2013.01)

(58) Field of Classification Search
CPC ....................................................... B23K 3/06
See application file for complete search history.

(56) References Cited

U.S. PATENT DOCUMENTS

| | | | |
|---|---|---|---|
| 6,003,753 A | 12/1999 | Hwang et al. | |
| 6,244,788 B1 | 6/2001 | Hernandez | |
| 6,253,985 B1 | 7/2001 | Kajii | |
| | (Continued) | | |

FOREIGN PATENT DOCUMENTS

| | | |
|---|---|---|
| CN | 101728287 A | 6/2010 |
| DE | 102004051983 B3 | 4/2006 |
| JP | 2005079492 A | 3/2005 |

OTHER PUBLICATIONS

PCT International Search Report and Written Opinion, PCT/EP2015/066194, dated Jan. 12, 2016, 14 pages.

(Continued)

*Primary Examiner* — Devang R Patel
(74) *Attorney, Agent, or Firm* — Quarles & Brady LLP

(57) ABSTRACT

The invention relates to a solder ball feeding device, comprising a solder ball reservoir for receiving an amount of solder balls and a metering device for dispensing a metered feeding amount of solder balls to a discharge device, wherein the metering device comprises an ultrasound device and a dispensing nozzle with a dispensing cannula, the ultrasound device serving to apply vibrations to the dispensing nozzle, and the solder ball reservoir or the dispensing (Continued)

nozzle of the solder ball reservoir being provided with a pressure connection which serves to introduce a pressurized gas into the solder ball feeding device.

7 Claims, 2 Drawing Sheets

(56) References Cited

U.S. PATENT DOCUMENTS

| | | | | |
|---|---|---|---|---|
| 6,270,002 | B1 * | 8/2001 | Hayashi | B23K 3/0623 228/2.1 |
| 6,533,159 | B1 | 3/2003 | Cobbley et al. | |
| 6,551,917 | B2 * | 4/2003 | Cobbley | H01L 21/6835 257/737 |
| 6,638,785 | B2 | 10/2003 | Shiozawa et al. | |
| 7,614,541 | B2 * | 11/2009 | Itoh | B23K 3/0623 228/246 |
| 8,328,068 | B2 | 12/2012 | Azdasht et al. | |
| 2002/0053591 | A1 | 5/2002 | Razon et al. | |
| 2002/0179696 | A1 | 12/2002 | Pattanaik et al. | |
| 2008/0296355 | A1 | 12/2008 | Costales et al. | |
| 2008/0302863 | A1 | 12/2008 | Zakel et al. | |
| 2010/0102444 | A1 | 4/2010 | Khor et al. | |
| 2010/0213243 | A1 | 8/2010 | Azdasht et al. | |

OTHER PUBLICATIONS

Japan Patent Office, Notice of Grounds of Rejection, Application No. 2017-500066, dated Sep. 5, 2018, 8 pages.

China National Intellectual Property Administration, First Office Action and Search Report, Application No. 201580038902.7, dated Nov. 5, 2018, 16 pages.

China National Intellectual Property Administration, Notification of Reexamination, Application No. 201580038902.7, dated Jun. 29, 2020, 21 pages.

Primary Welder Technology, compiled for general use by National Machinery Industry Committee, Nov. 1988, "flux conveyor", pp. 229, 267 Figures 6-15) [English Translation of Evidence 1 cited in Chinese Notification of Reexamination].

Automatic Arc Welding Machine, (the Soviet Union), Jan. 1959, Work Adjustment of Flexible Tube Type Automatic Welding Machine and Semi-automatic Welding Machine, pp. 197-198 [English Translation of Evidence 2 cited in Chinese Notification of Reexamination].

* cited by examiner

SOLDER BALL FEEDING DEVICE

This application is a divisional of U.S. patent application Ser. No. 15/323,797, filed Jan. 4, 2017, which is the national stage entry of PCT International Application No. PCT/EP2015/066194 filed Jul. 15, 2015 and claims priority to German Patent Application No. 10 2014 109 890.0 filed Jul. 15, 2014. The contents of these applications are hereby incorporated by reference as if set forth in their entirety herein for all purposes.

The invention relates to a solder ball feeding device, comprising a solder ball reservoir for receiving an amount of solder balls and a metering device for dispensing a metered feeding amount of solder balls to a discharge device, wherein the metering device comprises an ultrasound device and a dispensing nozzle with a dispensing cannula, the ultrasound device serving to apply vibrations to the dispensing nozzle, and the solder ball reservoir or the dispensing nozzle of the solder ball reservoir being provided with a pressure connection which serves to introduce a pressurized gas into the solder ball feeding device.

From DE 10 2004 051 983 A1, a solder ball transfer device with a transfer substrate and a discharge device is known. In the known device, the transfer substrate, which is embodied as a hole template, is arranged above the discharge device, the transfer substrate being subjected to a vacuum so as to suction solder balls, which are arranged in a randomly distributed manner below the transfer substrate in the discharge device, and to provide for an arrangement of the solder balls corresponding to the hole pattern of the template.

For the proper function of the known device, it is necessary that the discharge device has a sufficient filling level of solder balls so that the discharge device has to be constantly refilled during the continuous operation of the device. It has been found that filling level changes as small as possible are advantageous, which require the discharge device to be refilled with refilling quantities that are defined as exactly as possible.

It is the object of the present invention to propose a device of the kind mentioned in the beginning, which allows the discharge device to be refilled with an amount of solder balls that is metered as exactly as possible.

To attain this object, the device according to the invention exhibits the features of claim 1.

The solder ball feeding device according to the invention has a solder ball reservoir for receiving an amount of solder balls and a metering device for dispensing a metered feeding amount of solder balls to a discharge device. The metering device comprises an ultrasound device and a dispensing nozzle with a dispensing cannula, the ultrasound device serving to apply vibrations to the dispensing nozzle, and the solder ball reservoir or the dispensing nozzle of the solder ball reservoir being provided with a pressure connection which serves to introduce a pressurized gas into the solder ball feeding device.

The ultrasound device allows vibrations to be applied to the dispensing nozzle so that a "valve function" becomes possible at the metering device without the use of mechanical, mobile valve elements. In fact, the closing function of the "valve" is produced in that the solder balls become wedged against one another in the dispensing cannula of the dispensing nozzle when no ultrasound is applied to the dispensing nozzle so that the passage through the dispensing cannula is blocked. An application of ultrasonic vibrations to the dispensing nozzle causes the solder balls, which rest against one another in the dispensing cannula, to slide onto one another in a manner induced by the vibrations, the blockage in the dispensing cannula thus being dissolved by the application of ultrasound and solder balls arranged above the dispensing nozzle in the solder ball reservoir being able to flow through the dispensing cannula, supported by pressure applied to the solder balls by means of a gas.

The application of vibrations to the dispensing nozzle can take place directly by the ultrasound device immediately acting on the dispensing nozzle or indirectly by the ultrasound device acting on other areas or parts of the solder ball reservoir.

The ultrasound device can be embodied independent of the dispensing nozzle, wherein it is advantageous if the ultrasound device is arranged on a container body of the solder ball reservoir so as to allow a design of the dispensing nozzle that is independent of the ultrasound device.

It is preferred if the ultrasound device is arranged on the container body of the solder ball reservoir in a detachable manner by means of a support device.

If the pressure connection is arranged above a receiving chamber formed in the solder ball reservoir for receiving the amount of solder balls, it is ensured that pressure is applied evenly on all solder balls.

The container body can have a particularly simple geometry that is undisturbed by the pressure connection if the pressure connection is arranged in a container lid of the solder ball reservoir which covers the receiving chamber.

If a sealing device is arranged between the container lid and the container body, a pressure cushion that is substantially undisturbed by gas flows can be formed on the amount of solder balls received in the container body.

It is particularly advantageous for forming the "valve function" if the dispensing cannula has a duct diameter that is 2 to 8 times as large as the diameter of the solder balls.

Optimization of the "valve function" becomes possible if the duct diameter is 4 to 7 times as large as the diameter of the solder balls. In this manner, particularly quick response times of the "valve" can be achieved so that as little time as possible passes between a deactivation of the ultrasonic vibrations and a renewed blockage of the solder balls in the dispensing cannula, and thus only a very small amount of solder balls flows out of the dispensing cannula after deactivation. Moreover, there is only a time interval as short as possible between the activation of the ultrasonic vibrations and the dissolution of a blockage of solder balls in the dispensing cannula. Thus, a particularly high metering accuracy can be achieved overall.

A particularly quick adaptation of the solder ball feeding device to different operating conditions, which can be influenced by different diameters of the solder balls as well as by the ambient temperature or air humidity, becomes possible if the dispensing cannula is arranged in an exchangeable manner on the dispensing nozzle.

The transfer device according to the invention exhibits the features of claim 11.

According to the invention, the transfer device is connected to a solder ball feeding device according to the invention. Furthermore, the discharge device of the transfer device is provided with an ultrasound device for applying ultrasonic vibrations to the discharge device.

The application of ultrasonic vibrations to the discharge device ensures that potential local accumulations in the solder ball layer due to a filling process of the discharge device do not occur in the first place or are immediately leveled so that an even layer surface of the solder ball layer is provided. Thus, it can be made sure that the solder balls are optimally distributed in the discharge device when the solder ball layer is subjected to a vacuum in order to form a defined solder ball array on the transfer substrate.

In particular, the activation of the ultrasound device replaces a scraping function that would otherwise need to be realized either manually or with corresponding mechanical effort. Furthermore, the application of ultrasound to the discharge device can take place even while the transfer substrate is being subjected to the vacuum and during the formation of a solder ball array on the transfer substrate without impeding the latter. In fact, the ultrasound application to the discharge device additionally facilitates the formation of the solder ball array on the transfer substrate.

The connection of the discharge device to the solder ball feeding device provided with a metering device allows an automated or self-starting filling of the discharge device. Simultaneously, it is ensured by the application of ultrasound to the discharge device that the surface of the solder ball layer is leveled immediately after the filling or refilling of the discharge device by the metering device so that a defined filling level height is provided.

If the solder ball feeding device is connected to the discharge device via a flexible feeding duct, the ultrasound application to the dispensing nozzle can be decoupled from the ultrasound application to the discharge device and vice versa, if needed. In deviation therefrom, it is of course also possible to apply ultrasound to the discharge device simultaneously with the application of ultrasound to the dispensing nozzle.

If the discharge device has a supplying device beneath the bottom wall for supplying an ionized gas, the antistatic effect of the ionized gas can be utilized to increase the relative mobility of the solder balls arranged in the discharge device.

To support an automatic or self-starting filling of the discharge device with solder balls from the solder ball reservoir, it is advantageous if the discharge device is provided with a sensor device for monitoring the filling level, said sensor device interacting with the metering device and thus taking care, if needed, of an activation or deactivation of the metering device and of an opening or closing of the dispensing nozzle acting as a "valve".

It is particularly cost-effective if, for forming the sensor device, a light barrier device is arranged on the discharge device at the filling level height.

With regard to a functionally reliable and cost-effective design of the discharge device, it is advantageous if the discharge device has an annular circumferential wall which is provided with a bottom wall formed of a wire mesh.

In the following paragraphs, an embodiment of the transfer device will be explained in greater detail with the aid of the drawing.

Figure 1:
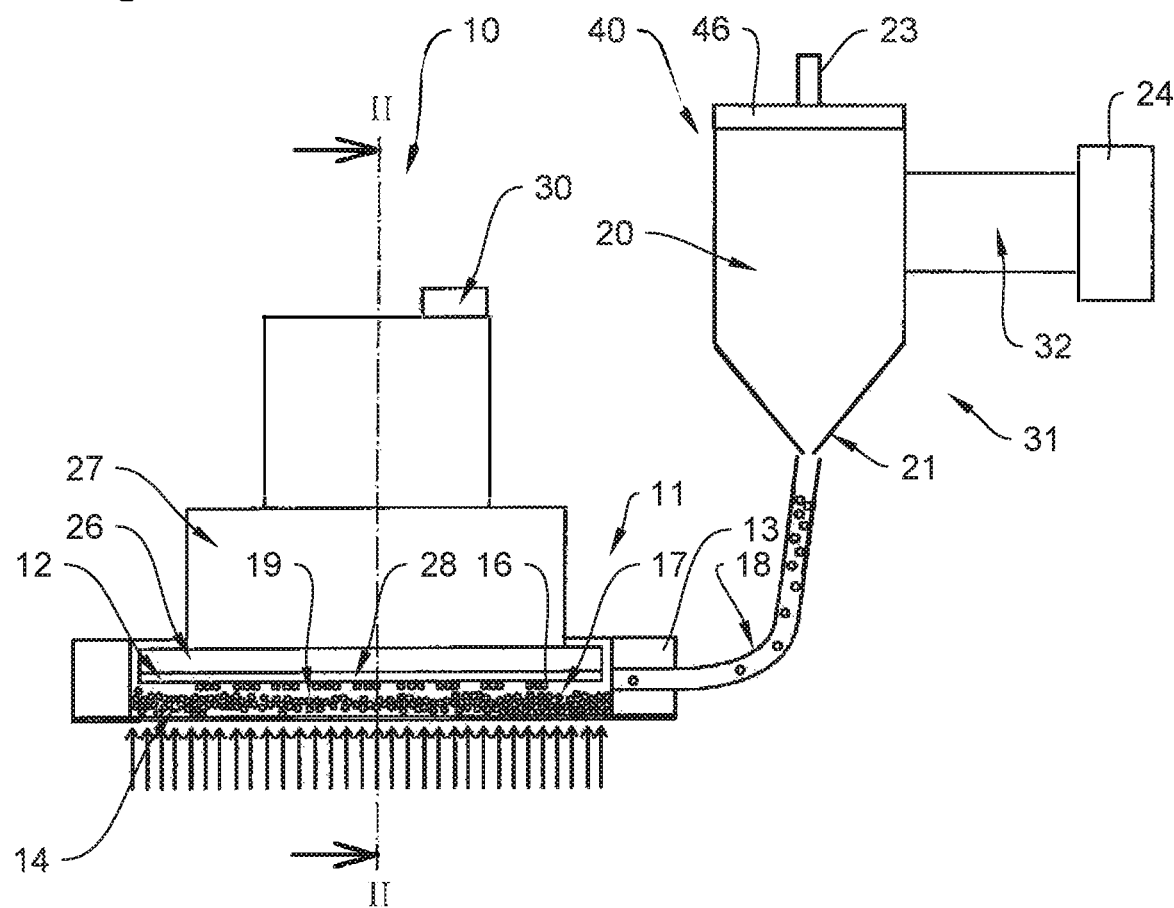
FIG. 1 shows a schematic illustration of a transfer device with a transfer substrate arranged within a discharge device.

FIG. 1 shows a transfer device 10 with a transfer substrate 12 arranged within a discharge device 11. The discharge device 11 has an annular circumferential wall 13 with a bottom wall 14 forming the lower end face of the circumferential wall 13. In the present embodiment example, the bottom wall 14 is formed of a net-like wire mesh which has a mesh size that is at least slightly smaller than the diameter of the solder balls 16 that are arranged in the discharge device 11 and which, in their entirety, form a solder ball layer 17 in the discharge device 11.

A solder ball receiving chamber 19, in which the solder ball layer 17 is located, is connected to a solder ball reservoir 20 of a solder ball feeding device 40 illustrated merely schematically in FIG. 1 via a feeding duct 18 formed elastic in this case, said solder ball reservoir 20 forming a storage device. At the bottom side of the solder ball reservoir 20, a dispensing nozzle 21 is arranged as an interface to the feeding duct 18. A receiving chamber 22 formed within the solder ball reservoir 20 is provided with a pressure connection 23 for introducing a pressurized gas, nitrogen being preferably used as said gas, in particular because of its reducing effect. The solder ball feeding device 40 is arranged on a frame 24, wherein a weighing device may be arranged between the solder ball reservoir 20 and the frame 24, which can trigger a refilling process of the solder ball reservoir 20, if needed.

The transfer substrate 12 arranged within the solder ball receiving chamber 19 in FIG. 1 is arranged at a bottom side of a connection device 26 of a handling device 27. The handling device 27, more precisely a support device holding the handling device 27, is provided with a vacuum device or a vacuum connection 30, which allows subjecting the solder ball receiving chamber 19 of the discharge device 11 to a vacuum from the rear through a hole pattern (not illustrated) formed in the transfer substrate 12. The handling device 27 serves to perform spatial adjusting motions of the transfer substrate 12 so that, on the one hand, the transfer substrate 12 can be conveyed into the receiving position illustrated in FIG. 1 for receiving a solder ball array 28 from the discharge device 11 and, on the other hand, it becomes possible to convey the solder ball array 28 arranged on the transfer substrate 12 into a contacting position (not illustrated), in which the solder ball array 28 coincides with contact points of a contact substrate. In order to be able to perform the thermal contacting of the solder ball array 28 with the contact substrate directly after the initial positioning of the solder ball array 28 in a contacting position, the handling device 27 can also be embodied as a so-called "bond head", which permits thermal treatment of the solder balls.

In the operation of the transfer device illustrated in FIG. 1, after the transfer substrate 12 has been positioned in the solder ball receiving chamber 19 of the discharge device 11, the solder ball receiving chamber 19 is subjected to a vacuum applied via the vacuum connection 30. Owing to the ventilation taking place through the perforated bottom wall 14 of the discharge device 11, scattered solder balls 16 are moved in cooperation with the vacuum from the solder ball layer 17 to form the solder ball array 28 illustrated in FIG. 1 in the hole pattern formed in the transfer substrate 12. The formation of the solder ball array 28 can be additionally facilitated by an application of ultrasound to the connecting device 26 holding the transfer substrate 12.

Figure 3:
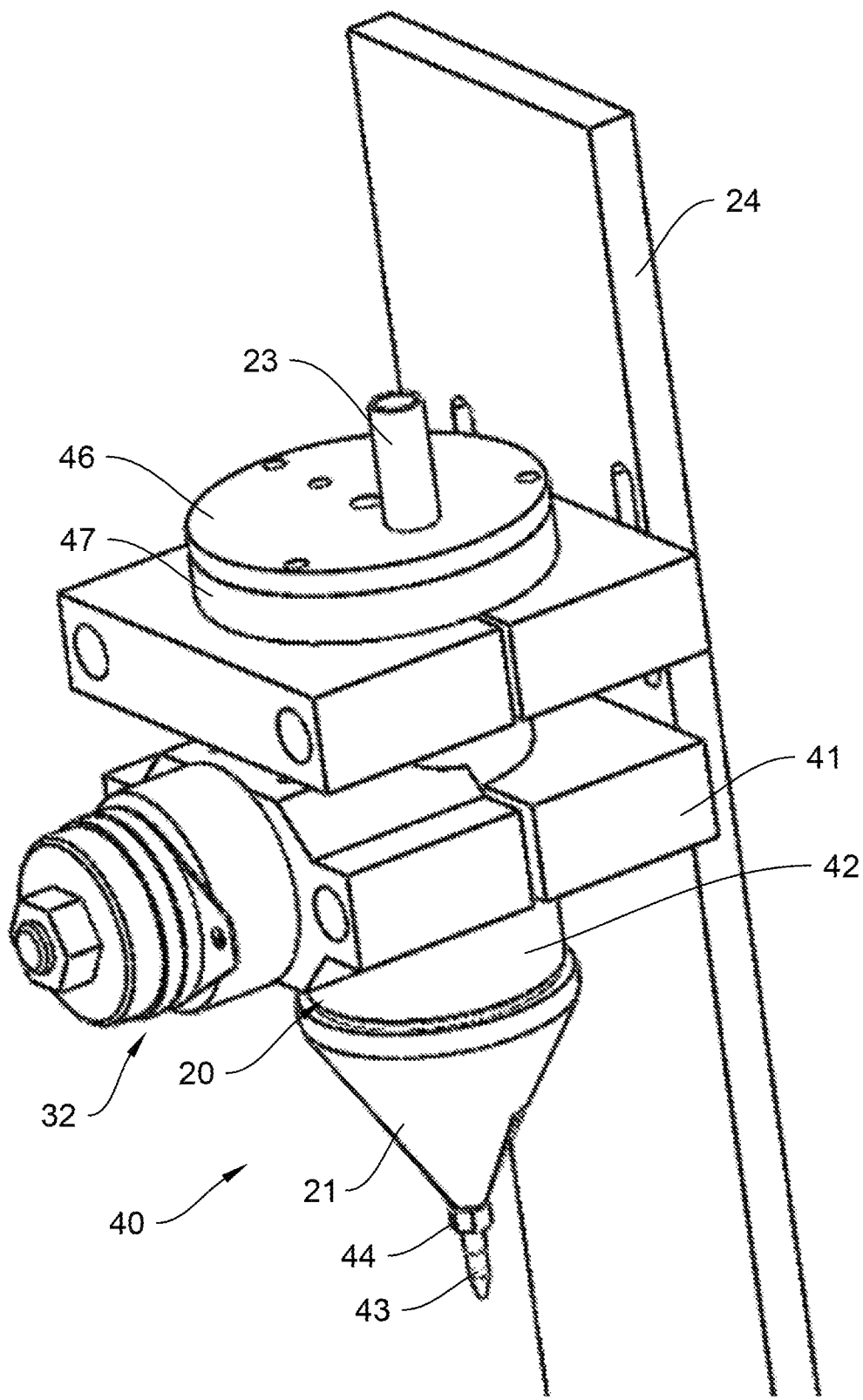
FIG. 3 shows an embodiment of the solder ball feeding device.

To ensure sufficient filling of the solder ball receiving chamber 19, the solder ball receiving chamber 19 is filled with solder balls 16 from the solder ball reservoir 20 via the solder ball feeding device 40, if needed. A metering of the feeding of solder balls 16 from the solder ball reservoir 20 corresponding to the given need takes place by way of a metering device 31 which comprises the dispensing nozzle 21 and an ultrasound device 32 applying vibrations to the dispensing nozzle 21, said ultrasound device 32 being arranged on a container body 42 of the solder ball reservoir 20 by means of a support device 41, as can be taken in particular from the embodiment illustrated in FIG. 3.

Figure 2:
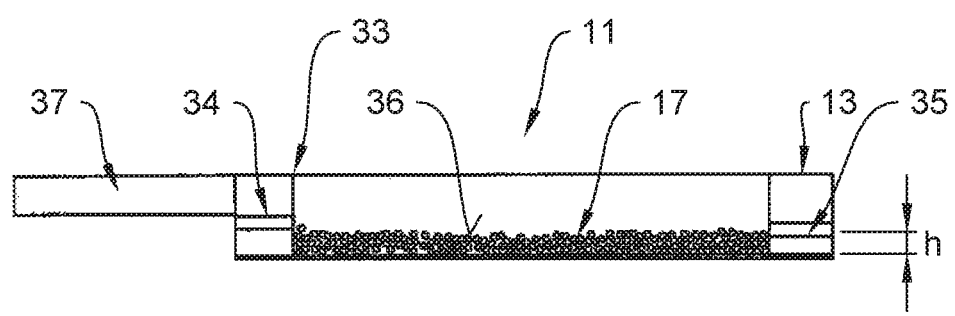
FIG. 2 shows the discharge device illustrated in FIG. 1 in a sectional view according to intersection line II-II in FIG. 1.

For triggering and controlling the metering device 31, the discharge device 11 is provided, as illustrated in FIG. 2, with a light barrier device 33, which, in the case of the present embodiment example, has a transmitter 34 and a receiver 35 which are respectively arranged at opposite points in the circumferential wall 13 of the discharge device 11. If the solder ball layer 17 formed in the solder ball receiving chamber 19 of the discharge device 11 falls below a filling level height h defined by the light barrier device 33, a contact between the transmitter 34 and the receiver 35 is triggered which activates the metering device 31.

To ensure a layer surface 36 that is substantially even or parallel to the bottom wall, an ultrasound device 37 is provided on the circumferential wall 13, which applies ultrasonic vibrations to the discharge device 11 and thus ensures a substantially even distribution of the solder balls 16, i.e. a layer surface 36 of the solder ball layer 17 that is substantially parallel to the bottom wall 14.

The metering device 31 is triggered via an activation of the ultrasound device 32, which applies ultrasonic vibrations to the dispensing nozzle 21. The dispensing nozzle 21 has a dispensing duct which here is formed by a dispensing cannula 43. In the present case, the dispensing cannula 43 is arranged on the dispensing nozzle 21 in an exchangeable manner by means of a cap nut 44. The opening cross-section of the dispensing cannula 43 is dimensioned in such a manner that the solder balls 16 can become wedged in the opening cross-section and thus a blockage can form. The occurrence of the wedging effect depends on the air humidity and on the oxygen supply in the solder ball reservoir 20, for example.

A pressure connection 23 is arranged in the container lid 46. By applying pressure to the amount of solder balls received in the receiving chamber 22 by way of a pressure cushion acting on the amount of solder balls and a gas flow interfusing the amount of solder balls and exiting through the dispensing cannula 43, the blockage is dissolved under simultaneous application of vibrations to the dispensing nozzle 21 so that the discharge device 11 can be refilled with solder balls 16 via the feeding duct 18 (FIG. 1). The ultrasound application to the dispensing nozzle 21 sets the solder balls 16, which are arranged in a mutually wedged manner in the dispensing cannula 43 of the dispensing nozzle 21, in a vibration-induced relative motion which dissolves the fixation of the solder balls 16 in the dispensing cannula 43 and allows the solder balls 16 arranged in the solder ball reservoir 20 to flow out through the dispensing cannula 43 and the feeding duct 18 into the solder ball receiving chamber 19 of the discharge device 11.

Upon interruption of the vibration application by deactivation of the ultrasound device 32 by means of the light barrier device 33 after the defined filling level height h has been reached again, a new blockage forms in the dispensing cannula 43 so that the feeding of further solder balls 16 into the discharge device 11 is interrupted.

By replacing the dispensing cannula 43, the opening cross-section of the feeding duct can be easily adapted to different solder ball diameters so as to achieve the valve effect for different solder ball diameters.

The invention claimed is:

1. A method for dispensing a metered feeding amount of solder balls from a solder ball reservoir to a discharge device using a solder ball feeding, device comprising:
    a solder ball reservoir receiving an amount of solder balls; and
    a metering device dispensing the metered feeding amount of solder balls; wherein the metering device comprises an ultrasound device and a dispensing nozzle with a dispensing cannula, the ultrasound device applying vibrations to the dispensing nozzle, and the solder ball reservoir being provided with a pressure connection connected to a pressurized gas device and introducing a pressurized gas into the solder ball feeding device, wherein the pressure connection is arranged in a container lid positioned above the solder ball reservoir and enclosing a top of the solder ball reservoir, wherein a sealing device is arranged between the container lid and a container body, and wherein the ultrasound device is supported by a support device arranged on the container body,
    the method comprising: applying a pressurized gas to the amount of solder balls received in the receiving chamber of the solder ball reservoir by applying a pressure cushion to the amount of solder balls while simultaneously applying vibrations to release the passage of solder balls through the dispensing cannula.

2. The method of claim 1, wherein the ultrasound device is independent of the dispensing nozzle.

3. The method of claim 2, wherein the ultrasound device is arranged on a container body of the solder ball reservoir.

4. The method of claim 3, wherein the ultrasound device is detachably arranged on the container body of the solder ball reservoir by the support device.

5. The method of claim 1, wherein the dispensing cannula has a duct diameter that is 2 to 8 times as large as the diameter of the solder balls.

6. The method of claim 5, wherein the duct diameter is 4 to 7 times as large as the diameter of the solder balls.

7. The method of claim 1, wherein the dispensing cannula is arranged in an exchangeable manner on the dispensing nozzle.

* * * * *